(12) United States Patent
Lee

(10) Patent No.: US 8,461,461 B2
(45) Date of Patent: Jun. 11, 2013

(54) EMBEDDED SUBSTRATE HAVING CIRCUIT LAYER ELEMENT WITH OBLIQUE SIDE SURFACE AND METHOD FOR MAKING THE SAME

(75) Inventor: Chih-Cheng Lee, Kaohsiung (TW)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 492 days.

(21) Appl. No.: 12/727,745

(22) Filed: Mar. 19, 2010

(65) Prior Publication Data
US 2010/0288542 A1    Nov. 18, 2010

(30) Foreign Application Priority Data
May 13, 2009 (TW) .................... 98115918 A

(51) Int. Cl.
*H05K 1/09* (2006.01)
(52) U.S. Cl.
USPC ................... 174/257; 174/261; 174/266
(58) Field of Classification Search
USPC .......................... 174/257, 261, 266
See application file for complete search history.

(56) References Cited

U.S. PATENT DOCUMENTS
2010/0181104 A1* 7/2010 Hotta et al. ............... 174/266

FOREIGN PATENT DOCUMENTS
| JP | 04056384 | 2/1992 |
| TW | 200913835 | 3/2009 |
| TW | 200915952 | 4/2009 |

* cited by examiner

*Primary Examiner* — Yuriy Semenenko
*Assistant Examiner* — Andargie M Aychillhum
(74) *Attorney, Agent, or Firm* — McCracken & Frank LLC

(57) ABSTRACT

The present invention relates to an embedded substrate having a circuit layer element with an oblique side surface and a method for making the same. The embedded substrate includes a dielectric layer and a circuit layer element. The dielectric layer has an upper surface and an accommodating groove. The circuit layer element is disposed in the accommodating groove. The circuit layer element has an upper surface, a chemical copper layer, a plating copper layer and an oblique side surface. The elevation of the upper surface is equal to or lower than that of the upper surface of the dielectric layer. The chemical copper layer includes palladium (Pd). The plating copper layer is disposed on the chemical copper layer. The oblique side surface is disposed on the upper surface of the circuit layer element, where is close to the wall of the accommodating groove, and extends downward from the upper surface of the circuit layer element to the wall of the accommodating groove. Therefore, the oblique side surface of the circuit layer element can avoid electrons gathering at a sharp edge of a conventional circuit layer element.

18 Claims, 8 Drawing Sheets

EMBEDDED SUBSTRATE HAVING CIRCUIT LAYER ELEMENT WITH OBLIQUE SIDE SURFACE AND METHOD FOR MAKING THE SAME

BACKGROUND OF THE INVENTION

1. Field of the Invention

The present invention relates to an embedded substrate and a method for making the same, and more particularly to an embedded substrate having a circuit layer element with an oblique side surface and a method for making the same.

2. Description of the Related Art

FIGS. 1 and 2 respectively show a cross-sectional view and a partial enlarged view of a conventional embedded substrate having a circuit layer element. The conventional embedded substrate 1 having the circuit layer element comprises a core layer 11, a first copper layer 12, a dielectric layer 13 and at least one circuit layer element. The first copper layer 12 is disposed on the core layer 11. The dielectric layer 13 is disposed on the first copper layer 12. The dielectric layer 13 has an upper surface 131 and an accommodating groove 132, 133, 134, and the accommodating groove 132, 133, 134 opens at the upper surface 131. The circuit layer element (for example, a conductive trace 14, a pad 15 or a through via 16) is disposed in the accommodating groove 132, 133, 134 of the dielectric layer 13.

The conventional embedded substrate 1 having a circuit layer element has the following disadvantages. The circuit layer element (for example, the conductive trace 14) has a sharp edge at a border with the dielectric layer 13. Because electrons 17 have the characteristic of easily gathering at the sharp edge during electrically conducting, the gathered electrons 17 induce more heat and more resistance at the sharp edge. Therefore, the signal strength will be lessened when transmitting.

Moreover, conventionally, an orientating land 18 must be formed before forming a through via 16, so that the accommodating groove 134 is then formed after confirming the position of the through via 16, which increase the contact area and the combining strength between the through via 16 and a solder (not shown). However, in order to form the orientating land 18, layout design must be well-considered, thus cause inconvenience.

Therefore, it is necessary to provide an embedded substrate having a circuit layer element with an oblique side surface and a method for making the same to solve the above problems.

SUMMARY OF THE INVENTION

The present invention is directed to an embedded substrate having a circuit layer element with an oblique side surface. The embedded substrate comprises a dielectric layer and a circuit layer element. The dielectric layer has an upper surface and an accommodating groove, and the accommodating groove opens at the upper surface. The circuit layer element is disposed in the accommodating groove of the dielectric layer. The circuit layer element comprises an upper surface, a chemical copper layer, a plating copper layer and an oblique side surface. The elevation of the upper surface is equal to or lower than that of the upper surface of the dielectric layer. The chemical copper layer is disposed on the wall of the accommodating groove, and the chemical copper layer comprises palladium (Pd). The plating copper layer is disposed on the chemical copper layer. The oblique side surface is disposed on the upper surface of the circuit layer element, where is close to the wall of the accommodating groove, and extends downward from the upper surface of the circuit layer element to the wall of the accommodating groove.

The present invention is further directed to a method for making an embedded substrate having a circuit layer element with an oblique side surface. The method comprises the following steps: (a) providing a substrate, wherein the substrate comprises a dielectric layer, and the dielectric layer has an upper surface; (b) removing part of the dielectric layer from the upper surface of the dielectric layer, so as to form at least one accommodating groove, wherein the accommodating groove opens at the upper surface; (c) forming a chemical copper layer on the wall of the accommodating groove and the upper surface of the dielectric layer, wherein the chemical copper layer comprises palladium (Pd); (d) forming a plating copper layer on the chemical copper layer and filling up the accommodating groove; (e) removing part of the chemical copper layer and part of the plating copper layer, which are disposed on the upper surface of the dielectric layer, so as to form a circuit layer element; and (f) wet etching the circuit layer element by an etchant, so as to remove part of the circuit layer element and form an upper surface and an oblique side surface of the circuit layer element, wherein the oblique side surface is disposed on the upper surface of the circuit layer element, where is close to the wall of the accommodating groove, and extends downward from the upper surface of the circuit layer element to the wall of the accommodating groove, the elevation of the upper surface of the circuit layer element is equal to or lower than that of the upper surface of the dielectric layer.

Therefore, an anchor-shaped gap is formed between the oblique side surface of the circuit layer element and the wall of the accommodating groove, which can avoid electrons gathering at a sharp edge of a conventional circuit layer element and lessening signal strength.

DETAILED DESCRIPTION OF THE INVENTION

Figure 3:
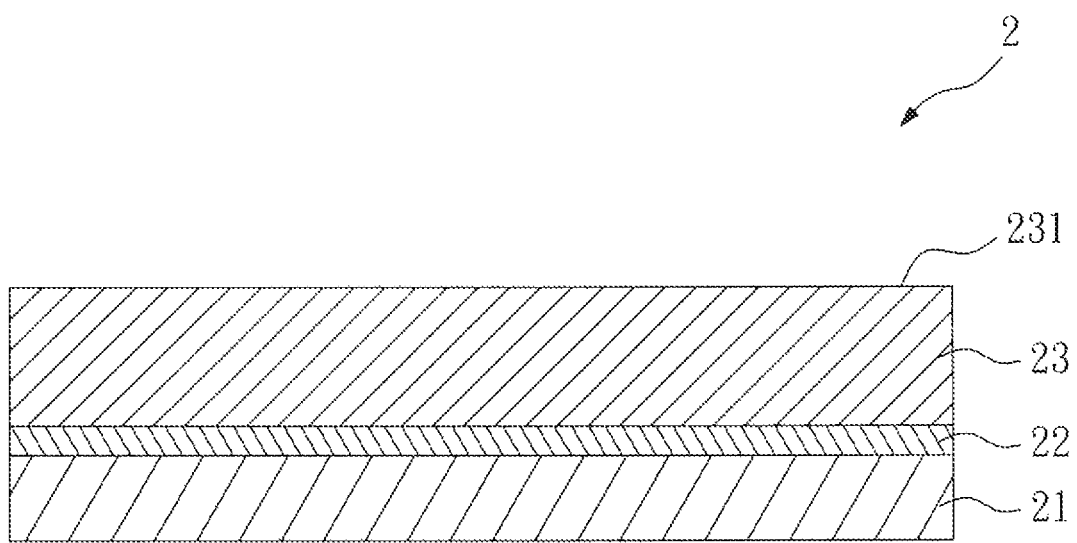
FIGS. 3 to 8 are schematic views of a method for making an embedded substrate having a circuit layer element with an oblique side surface according to the present invention.

FIGS. 3 to 8 show schematic views of a method for making an embedded substrate having a circuit layer element with an oblique side surface according to the present invention. As shown in FIG. 3, a substrate 2 is provided. The substrate 2 comprises a dielectric layer 23 having an upper surface 231. In the embodiment, the substrate 2 further comprises a core layer 21 and a first copper layer 22. The first copper layer 22 is disposed on the core layer 21, and the dielectric layer 23 is disposed on the first copper layer 22.

Figure 4:
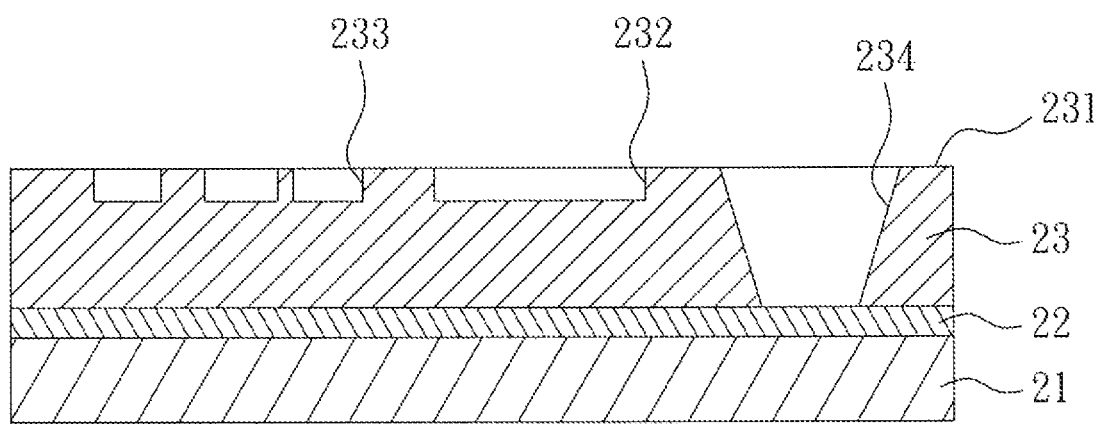

As shown in FIG. 4, part of the dielectric layer 23 is removed from the upper surface 231 of the dielectric layer 23, so as to form at least one accommodating groove 232, 233, 234. The accommodating groove 232, 233, 234 opens at the upper surface 231, and has a pattern from top view. In the embodiment, part of the dielectric layer 23 is removed from the upper surface 231 of the dielectric layer 23 by laser or plasma, and one of the accommodating groove (the accommodating groove 234) penetrates through the dielectric layer 23 and exposes part of the first copper layer 22.

Figure 5:
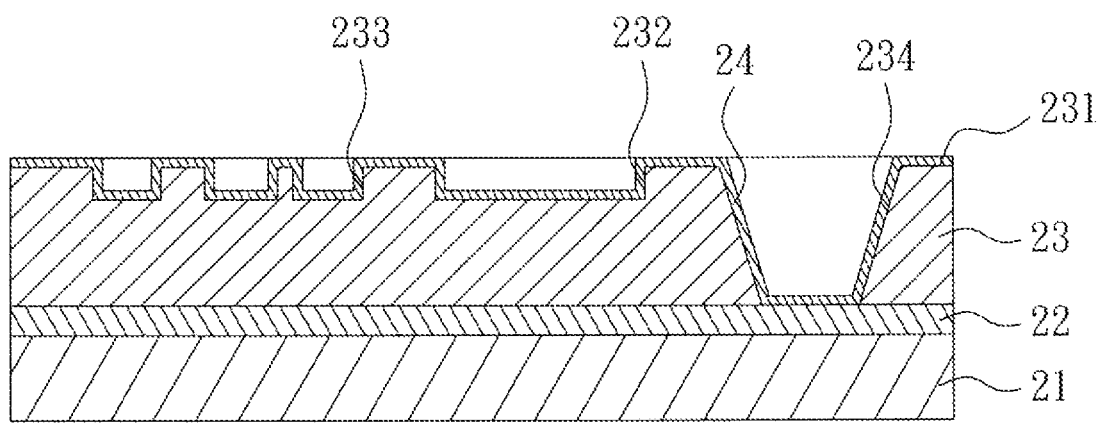

As shown in FIG. 5, a chemical copper layer 24 is formed on the wall of the accommodating groove 232, 233, 234 and the upper surface 231 of the dielectric layer 23. The chemical copper layer 24 comprises palladium (Pd). In the embodiment, the chemical copper layer 24 is formed by chemical plating, and the chemical copper layer 24 is further formed on part of the first copper layer 22.

Figure 6:
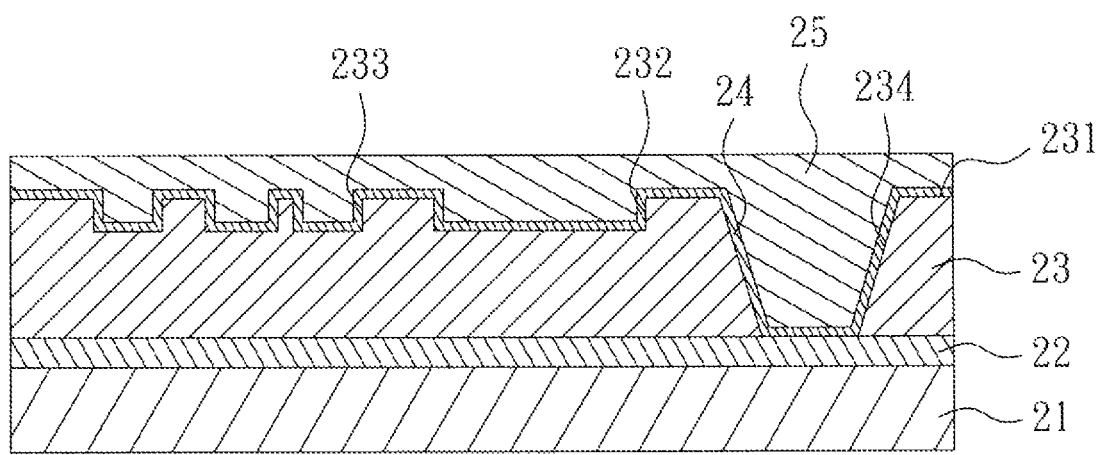

As shown in FIG. 6, a plating copper layer 25 is formed on the chemical copper layer 24, and fills up the accommodating groove 232, 233, 234. In the embodiment, the plating copper layer 25 is formed by electroplating.

Figure 7:
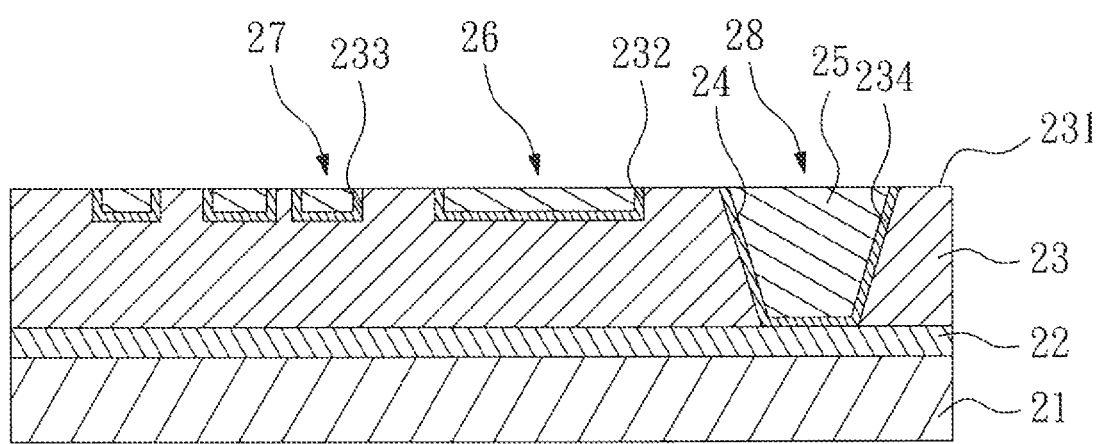

As shown in FIG. 7, part of the chemical copper layer 24 and part of the plating copper layer 25, which are disposed on the upper surface 231 of the dielectric layer 23, are removed, so as to form a circuit layer element. In the embodiment, part of the chemical copper layer 24 and part of the plating copper layer 25 are removed by grinding, polishing, etching or chemical-mechanical polishing (CMP). The circuit layer element may be a pad 26, a conductive trace 27 or a through via 28.

Figure 8:
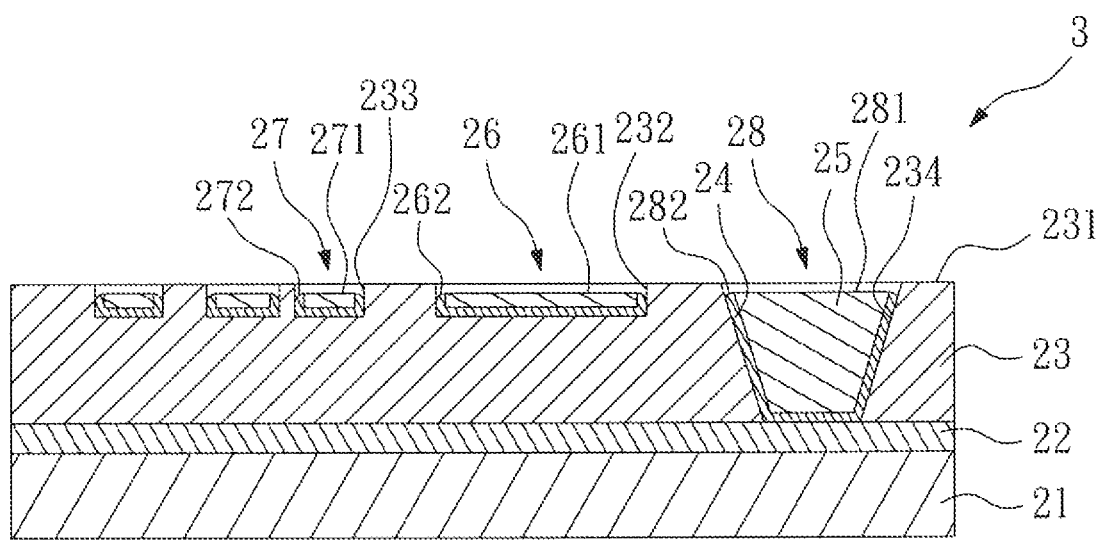

As shown in FIG. 8, the circuit layer element is wet etched by an etchant, so as to remove part of the circuit layer element and form an upper surface 261, 271, 281 and an oblique side surface 262, 272, 282 of the circuit layer element. Meanwhile, an embedded substrate 3 having a circuit layer element with an oblique side surface according to the present invention is formed. The oblique side surface 262, 272, 282 is disposed on the upper surface 261, 271, 281 of the circuit layer element, where is close to the wall of the accommodating groove 232, 233, 234, and extends downward from the upper surface 261, 271, 281 of the circuit layer element to the wall of the accommodating groove 232, 233, 234. The elevation of the upper surface 261, 271, 281 of the circuit layer element is equal to or lower than that of the upper surface 231 of the dielectric layer 23.

Figure 9:
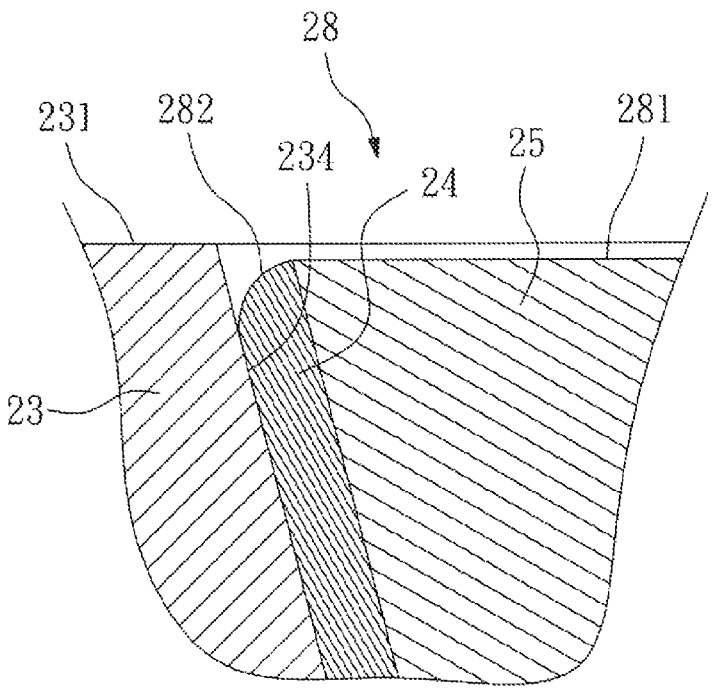
FIG. 9 is a partial enlarged view of FIG. 8.
Figure 10:
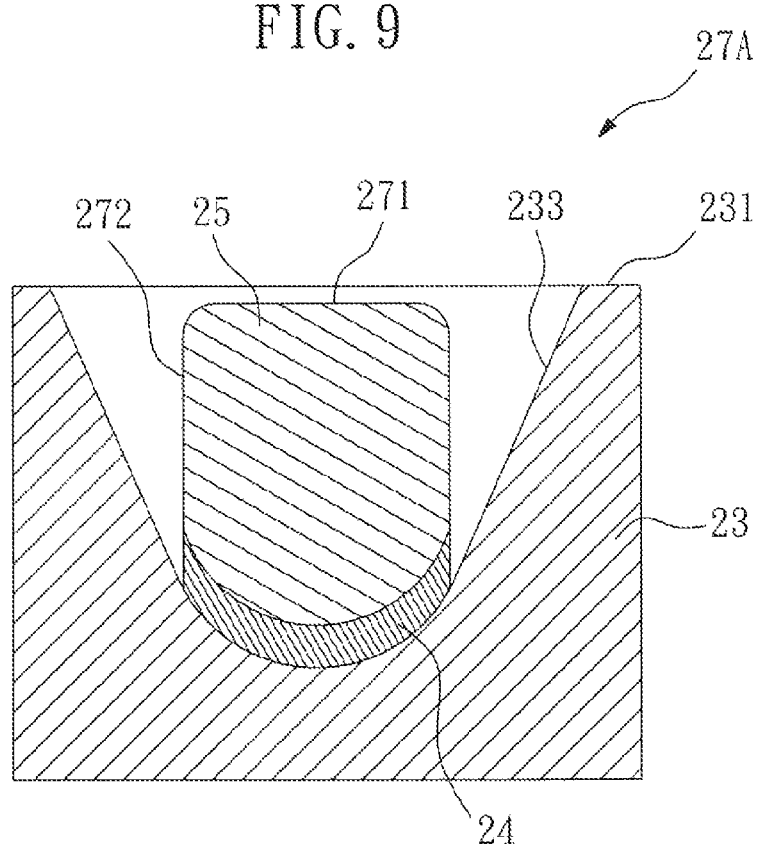
FIG. 10 is a partial enlarged view of a circuit layer element of an embedded substrate having the circuit layer element with an oblique side surface according to a preferable embodiment of the present invention.

In the embodiment, the etchant comprises sulfuric acid, hydrogen peroxide and stabilizing agent. As shown in FIG. 9, the shape of the oblique side surface 282 of the through via 28 is arc, so as to form an anchor-shaped gap between the oblique side surface 262, 272, 282 of the circuit layer element and the wall of the accommodating groove 232, 233, 234. In this embodiment, the oblique side surface 282 connects the wall of the accommodating groove 234, wherein the oblique side surface 282 is not coplanar with the upper surface 281 of the circuit layer element, and a distance (or a notch) is formed between the oblique side surface 282 and the wall of the accommodating groove 234. However, in other applications, when the etching duration last for a long time, the cross-sectional shape of the circuit layer element (for example, a conductive trace 27A) may be similar to rectangle, as shown in FIG. 10. Preferably, the interval between the upper surface 261, 271, 281 of the circuit layer element and the upper surface 231 of the dielectric layer 23 is less than 10 82 m. Preferably, after the step of wet etching, the method further comprises a step of filling a solder into the gap between the oblique side surface 262, 272, 282 of the circuit layer element and the wall of the accommodating groove 232, 233, 234.

The element palladium (Pd) of the chemical copper layer 24 reacts with the stabilizing agent of the etchant, so that the reaction rate of the chemical copper layer 24 and the etchant is faster than that of the plating copper layer 25 and the etchant. Therefore, when the chemical copper layer 24 and the plating copper layer 25 is etched simultaneously by the etchant, the etched depth of the chemical copper layer 24 that is disposed at the periphery is deeper than that of the plating copper layer 25, and therefore the oblique side surface 262, 272, 282 is formed.

Figure 1:
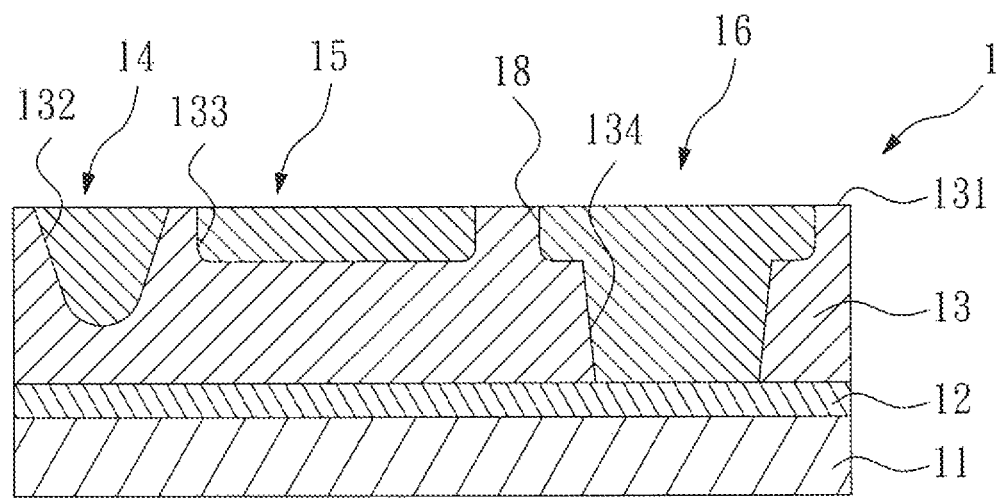
FIG. 1 is a cross-sectional view of a conventional embedded substrate having a circuit layer element.
Figure 2:
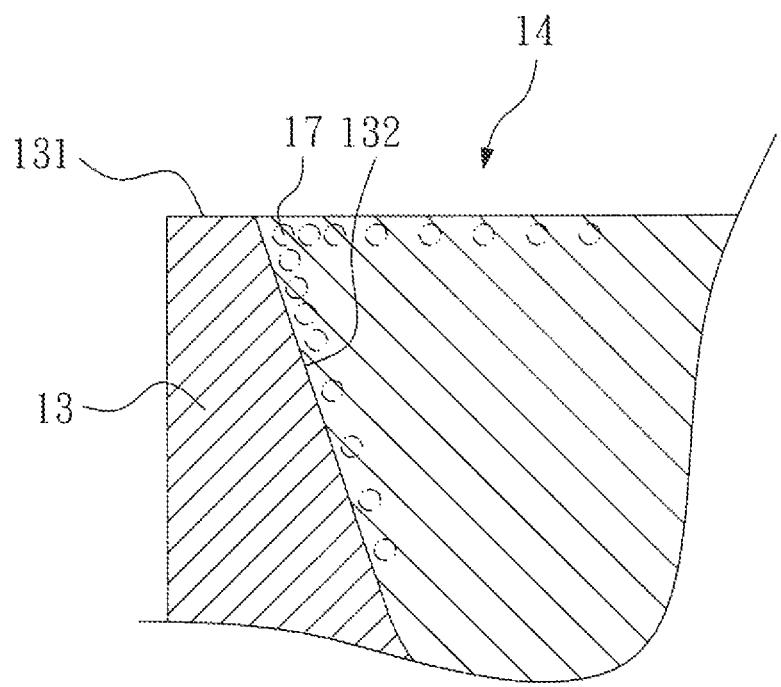
FIG. 2 is a partial enlarged view of FIG. 1.

Therefore, the oblique side surface 262, 272, 282 of the circuit layer element can avoid electrons gathering at a sharp edge of a conventional circuit layer element and lessening signal strength. Moreover, an anchor-shaped gap is formed between the oblique side surface 262, 272, 282 of the circuit layer element and the wall of the accommodating groove 232, 233, 234, which can increase the contact area and the combining strength between the circuit layer element and a solder. Thus, the area of the conventional orientating land 18 (FIG. 1) is reduced, or the orientating land 18 is even omitted. Therefore, the through via 28 according to the present invention is landless, so as to increase the flexibility of layout designing.

FIGS. 8 and 9 respectively show a cross-sectional view and a partial enlarged view of an embedded substrate having a circuit layer element with an oblique side surface. The embedded substrate 3 having a circuit layer element with an oblique side surface comprises a dielectric layer 23 and a circuit layer element. The dielectric layer 23 has an upper surface 231 and an accommodating groove 232, 233, 234. The accommodating groove 232, 233, 234 opens at the upper surface 231. The circuit layer element (for example, a pad 26, a conductive trace 27 or a through via 28) is disposed in the accommodating groove 232, 233, 234 of the dielectric layer 23. The circuit layer element has an upper surface 261, 271, 281, a chemical copper layer 24, a plating copper layer 25 and an oblique side surface 262, 272, 282. The elevation of the upper surface 261, 271, 281 is equal to or lower than that of the upper surface 231 of the dielectric layer 23. The chemical copper layer 24 is disposed on the wall of the accommodating groove 232, 233, 234, and the chemical copper layer 24 comprises palladium (Pd). The plating copper layer 25 is disposed on the chemical copper layer 24. The oblique side surface 262, 272, 282 is disposed on the upper surface 261, 271, 281 of the circuit layer element, where is close to the wall of the accommodating groove 232, 233, 234, and extends downward from the upper surface 261, 271, 281 of the circuit layer element to the wall of the accommodating groove 232, 233, 234.

In the embodiment, the embedded substrate 3 having a circuit layer element with an oblique side surface further comprises a core layer 21 and a first copper layer 22. The first copper layer 22 is disposed on the core layer 21, and the dielectric layer 23 is disposed on the first copper layer 22. One of the accommodating groove 232, 233, 234 of the dielectric layer 23 penetrates through the dielectric layer 23 and exposes part of the first copper layer 22. The chemical copper layer 24 is further formed on part of the first copper layer 22.

Preferably, the interval between the upper surface 261, 271, 281 of the circuit layer element and the upper surface 231 of the dielectric layer 23 is less than 10 μm, and the shape of the oblique side surface 262, 272, 282 of the circuit layer element is arc. However, in other applications, the cross-sectional shape of the circuit layer element is similar to rectangle, as shown in FIG. 10, and the embedded substrate 3 further comprises a solder filling into the gap between the oblique side surface 262, 272, 282 of the circuit layer element and the wall of the accommodating groove 232, 233, 234.

While several embodiments of the present invention have been illustrated and described, various modifications and improvements can be made by those skilled in the art. The embodiments of the present invention are therefore described in an illustrative but not restrictive sense. It is intended that the present invention should not be limited to the particular forms illustrated, and that all modifications which maintain the spirit and scope of the present invention are within the scope defined by the appended claims.

What is claimed is:

1. An embedded substrate having a circuit layer element with an oblique side surface, comprising:
   a dielectric layer, having an upper surface and an accommodating groove, wherein the accommodating groove opens at the upper surface; and
   a circuit layer element, disposed in the accommodating groove of the dielectric layer, wherein the circuit layer element comprises:
   an upper surface, wherein the elevation of the upper surface is equal to or lower than that of the upper surface of the dielectric layer;
   a chemical copper layer, disposed on the wall of the accommodating groove, wherein the chemical copper layer comprises palladium (Pd);
   a plating copper layer, disposed on the chemical copper layer; and
   an oblique side surface, connecting the wall of the accommodating groove, wherein the oblique side surface is not coplanar with the upper surface of the circuit layer element, and a distance is formed between the oblique side surface and the wall of the accommodating groove.

2. The embedded substrate as claimed in claim 1, further comprising a core layer and a first copper layer, wherein the first copper layer is disposed on the core layer, and the dielectric layer is disposed on the first copper layer.

3. The embedded substrate as claimed in claim 2, wherein the accommodating groove of the dielectric layer penetrates through the dielectric layer and exposes part of the first copper layer, and the chemical copper layer is further formed on part of the first copper layer.

4. The embedded substrate as claimed in claim 1, wherein the interval between the upper surface of the circuit layer element and the upper surface of the dielectric layer is less than 10 μm.

5. The embedded substrate as claimed in claim 1, wherein the circuit layer element is a pad, a conductive trace or a through via.

6. The embedded substrate as claimed in claim 1, wherein the shape of the oblique side surface of the circuit layer element is arc.

7. The embedded substrate as claimed in claim 1, wherein the cross-sectional shape of the circuit layer element is similar to rectangle.

8. The embedded substrate as claimed in claim 1, further comprising a solder filling into the gap between the oblique side surface of the circuit layer element and the wall of the accommodating groove.

9. An embedded substrate having a circuit layer element with an oblique side surface, comprising:
   a dielectric layer, having an upper surface and an accommodating groove, wherein the accommodating groove opens at the upper surface; and
   a circuit layer element, disposed in the accommodating groove of the dielectric layer, wherein the circuit layer element comprises an upper surface and an oblique side surface, the elevation of the upper surface is equal to or lower than that of the upper surface of the dielectric layer, the oblique side surface is disposed on the upper surface of the circuit layer element, which is close to the wall of the accommodating groove, and extending downward from the upper surface of the circuit layer element to the wall of the accommodating groove, so as to form an anchor-shaped gap between the oblique side surface of the circuit layer element and the wall of the accommodating groove.

10. The embedded substrate as claimed in claim 9, further comprising a core layer and a first copper layer, wherein the first copper layer is disposed on the core layer, and the dielectric layer is disposed on the first copper layer.

11. The embedded substrate as claimed in claim 10, wherein the accommodating groove of the dielectric layer penetrates through the dielectric layer and exposes part of the first copper layer, and the chemical copper layer is further formed on part of the first copper layer.

12. The embedded substrate as claimed in claim 9, wherein the interval between the upper surface of the circuit layer element and the upper surface of the dielectric layer is less than 10 μm.

13. The embedded substrate as claimed in claim 9, wherein the circuit layer element is a pad, a conductive trace or a through via.

14. The embedded substrate as claimed in claim 9, wherein the shape of the oblique side surface of the circuit layer element is arc.

15. The embedded substrate as claimed in claim 9, wherein the cross-sectional shape of the circuit layer element is similar to rectangle.

16. The embedded substrate as claimed in claim 9, further comprising a solder filling in the anchor-shaped gap.

17. The embedded substrate as claimed in claim 9, wherein the circuit layer element further comprises a chemical copper layer and a plating copper layer, the chemical copper layer is disposed on the wall of the accommodating groove and the plating copper layer is disposed on the chemical copper layer.

18. The embedded substrate as claimed in claim 17, wherein the chemical copper layer comprises palladium (Pd).

* * * * *